United States Patent
Haramoto et al.

(10) Patent No.: US 7,436,259 B2
(45) Date of Patent: Oct. 14, 2008

(54) AMPLIFICATION APPARATUS

(75) Inventors: Ryoki Haramoto, Tokyo (JP); Junya Dosaka, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 10/556,395

(22) PCT Filed: May 18, 2004

(86) PCT No.: PCT/JP2004/007104

§ 371 (c)(1),
(2), (4) Date: Jul. 16, 2007

(87) PCT Pub. No.: WO2004/105232

PCT Pub. Date: Dec. 2, 2004

(65) Prior Publication Data

US 2008/0055000 A1  Mar. 6, 2008

(51) Int. Cl.
*H03F 3/66* (2006.01)
(52) U.S. Cl. ........................................ 330/52; 330/151
(58) Field of Classification Search ................... 330/52, 330/149, 151
See application file for complete search history.

(56) References Cited

U.S. PATENT DOCUMENTS 6,069,527 A * 5/2000 Maruyama .................... 330/51
6,157,254 A * 12/2000 Myer ........................... 330/52
6,326,840 B1 * 12/2001 Funada et al. ................. 330/52
6,340,915 B1 * 1/2002 Blodgett ....................... 330/52

FOREIGN PATENT DOCUMENTS

| EP | 0 685 931 | 12/1995 |
|---|---|---|
| EP | 1 189 339 | 3/2002 |
| JP | 11-261343 | 9/1999 |
| JP | 2002-076783 | 3/2002 |
| JP | 2002-76786 | 3/2002 |

* cited by examiner

*Primary Examiner*—Henry K Choe
(74) *Attorney, Agent, or Firm*—Wenderoth, Lind & Ponack, L.L.P

(57) ABSTRACT

An amplification apparatus that has a distortion detection loop that detects distortion components contained in an amplified signal to be amplified that is amplified by an amplifier 3, and a distortion removal loop that removes distortion components from the amplified signal, using the distortion components detected by the distortion detection loop, combines a reference signal (pilot signal) with the signal to be amplified, and performs control relating to distortion compensation, using said reference signal, to provide improved efficiency with respect to a configuration to perform control relating to distortion compensation, using a reference signal. A signal to be amplified is detected by amplification signal detection means 11~13 and 21, and when it is detected by the amplification signal detection means that there is no input of a signal to be amplified, reference signal control means 21, 15 perform control to effect non-output of the reference signals.

4 Claims, 8 Drawing Sheets

(a) RF Input (b) Wave detection circuit
    output voltage (c) Operational amplifier output (a) Burst signal (b) Amplification apparatus output Pilot signal is output during Off

AMPLIFICATION APPARATUS

TECHNICAL FIELD

This invention relates to an amplification apparatus equipped with a distortion detection loop and a distortion removal loop that compensates for distortion generated by an amplifier, and particularly to an amplification apparatus that provides improved efficiency with respect to a configuration that carries out control relating to distortion compensation, using a reference signal.

BACKGROUND ART

In fields such as communications, for example, signals are amplified by amplifiers, and distortion generated by amplifiers in the course of amplifying signals is compensated for.

Specifically, amplification apparatuses equipped with a distortion detection loop and a distortion removal loop that use the feedforward method to perform distortion compensation, and amplification apparatuses equipped with a predistorter that use the predistortion method to perform distortion compensation, are being studied. Also being studied is the use of pilot signals constituting reference signals to perform control relating to distortion compensation.

An example of the prior technology will now be described.

In the past, in a feedforward type distortion compensation amplifier equipped with a distortion detection loop and a distortion removal loop, the level of a pilot signal was adjusted based on the level of a signal corresponding to an input signal (see, for example, Patent Document 1).

In the past, in a power amplifier having feedforward type distortion compensation functions, control was effected so that there was always a signal constituting the reference for distortion compensation (see, for example, Patent Document 2).

In the past, when a pilot signal frequency has been set to a first frequency outside the band in a feedforward type common amplifier, based on the frequency dependency of the amount of distortion suppression, the pilot signal frequency was reset to a second frequency within the band so that the level of the pilot signal did not exceed a level at which it would become spurious within the band (see, for example, Patent Document 3).

Patent Document 1

Unexamined Patent Publication No. 2002-76786.

Patent Document 2

Unexamined Patent Publication No. 2002-185267.

Patent Document 3

Unexamined Patent Publication No. 2002-176320.

Patent Document 4

Unexamined Patent Publication No. 2002-76783.

However, the conventional amplification apparatus with distortion compensation capability (distortion compensation amplification apparatus) was still lacking with respect to the configuration for controlling the distortion compensation using a reference signal, so there was a need for further development.

The present invention was accomplished in light of these conventional circumstances, and has as its object to provide, in a configuration that compensates for distortion generated in an amplifier equipped with a distortion detection loop and a distortion removal loop, an amplification apparatus that can improve efficiency with respect to a configuration for control relating to distortion compensation using a reference signal.

DISCLOSURE OF THE INVENTION

To attain the above object, the amplification apparatus of this invention performs the following processing in detecting distortion components contained in a signal to be amplified that is amplified by an amplifier, removing distortion components from the amplified signal in a distortion removal loop, using distortion components detected by a distortion detection loop, combining a reference signal with the signal to be amplified and using the reference signal to perform control relating to distortion compensation.

That is, the signal to be amplified is detected and a reference signal control means controls the output of the reference signal according to the state of the detected signal to be amplified.

Therefore when, for example, the reference signal is not needed, the configuration of the control relating to distortion compensation using a reference signal can be made efficient by effecting control whereby the reference signal is not inserted into the signal to be amplified. Specifically, this can decrease electric power consumption and improve the characteristics of the amplified signal.

Also, various modes may be used as the mode of controlling the output of the reference signal according to the state of the signal to be amplified, such as a mode of control to have no reference signal output when there is no input of a signal to be amplified, or a mode of control to have no reference signal output when the level of a burst signal constituting the signal to be amplified is relatively low. Also, various states may be used as the state of the signal to be amplified, such as the presence or absence of signal input, signal level, signal type, signal timing, and so forth.

Various signals may be used as the signal to be amplified, such as for example communication signals and the like in the communications field.

The amplifier can be any of various types, such as for example one that consists of one amplifying element, or a combination of a plurality of amplifying elements.

Three-dimensional distortion and other such distortion components are examples of distortion components that may be used.

Also, the distortion components detected by the distortion detection loop may be just those distortion components, or may be detected in a form that includes those distortion components and other signals.

Various degrees may be used as the degree of removal of distortion components from the amplified signal; that is, various accuracies may be used as the distortion compensation accuracy.

Also, various configurations may be used for the distortion detection loop and the distortion removal loop.

Also, various signals may be used as the reference signal.

Also, various locations may be used as the location at which the reference signal is combined with the signal to be amplified.

After combining the reference signal with the signal to be amplified, various locations may be used as the location for detecting information relating to the reference signal.

The number of reference signals used may be any of various numbers. For example, a single reference signal may be used, or a plurality of reference signals.

When a plurality of reference signals is used, some or all of the frequency, location of combination with the signal to be amplified, location at which information relating to the reference signal is detected and so forth of each of the reference signals may differ.

Also, various modes may be used as the mode of control relating to the distortion compensation using a reference signal. For example, a control mode may be used that improves the accuracy of the distortion compensation based on a reference signal.

In addition, when a plurality of reference signals is used, whether or not control is performed by the reference signal control means may be set for each of the reference signals so that, for example, a mode may be used in which the reference signal control means effects no output of any reference signal, or a mode may be used in which the reference signal control means effects no output of just some prescribed reference signals.

The amplification apparatus of this invention performs the following processing in detecting distortion components contained in a signal to be amplified that is amplified by an amplifier, removing distortion components from the amplified signal in a distortion removal loop, using distortion components detected by a distortion detection loop, combining a reference signal with the signal to be amplified and using the reference signal to perform control relating to distortion compensation.

That is, a signal to be amplified is detected by an amplification signal detection means, and when it is detected by the amplification signal detection means that there is no input of a signal to be amplified (that is, input does not take place), the reference signal control means performs control to effect non-output of a reference signal (that is, output does not take place).

Therefore, since it is controlled for there to be non-output of a reference signal when there is no input of a signal to be amplified, that is, when there is no need for a reference signal due to there being no input of a signal to be amplified, there is no insertion of a reference signal into a signal to be amplified, thereby enabling efficiency with respect to a control configuration relating to distortion compensation using a reference signal. Specifically, for example, this can make it possible to decrease electric power consumption and improve the characteristics of the amplified signal.

Here, that there is no input of a signal to be amplified (no input signal) can, for example, be constituted by a signal to be amplified not being input, or by a signal to be amplified that is input but has an input level that is small enough to be determined in practice as not constituting an input.

Various ways may be used as the way of detecting there is no input of a signal to be amplified (no input signal). These include, for example, using the level of a signal input as a signal to be amplified, or changes in level, or wave forms and the like as a basis for determining whether or not a signal to be amplified is being input, or using the cycle period of a signal input as a signal to be amplified as a basis for determining whether or not a signal to be amplified is being input, or using information related to the timing a signal to be amplified is due to be input as a basis for determining whether or not a signal to be amplified is being input.

Also, various modes may be used as the control mode for effecting non-output of the reference signal. For example, a mode can be used in which the reference signal is oscillated or generated but non-output of the oscillated or generated reference signal is effected by blocking the output of the portion that is output to combine the reference signal with the signal to be amplified, or a mode can be used in which non-output is effected by stopping the oscillation or generation of the reference signal in the processing unit that constitutes the source of the oscillation or generation.

Also, the reference signal control means can use a control mode to output a reference signal and combine the reference signal with the signal to be amplified at times other than when there is no input of a signal to be amplified (no input signal), that is, when there is an input of a signal to be amplified.

The amplification apparatus of this invention performs the following processing in detecting distortion components contained in a signal to be amplified that is amplified by an amplifier, removing distortion components from the amplified signal in a distortion removal loop, using distortion components detected by a distortion detection loop, combining a reference signal with the signal to be amplified and using the reference signal to perform control relating to distortion compensation, when a burst signal, for example, is input as the signal to be amplified.

That is, an amplification signal level detection means detects the level of the signal to be amplified, and, in response to the level detected by the amplification signal level detection means, the reference signal control means performs control to effect non-combination of the reference signal with the signal to be amplified (that is, combination does not take place).

Therefore when, for example, the level of a signal to be amplified is relatively low, a burst signal to be amplified is determined to be a no input state (that is, a state of no input taking place), and control is performed to effect non-combination of the reference signal with the signal to be amplified, that is, when the reference signal is not needed due to the burst signal to be amplified being in a no input state, the reference signal is not inserted into the signal to be amplified, so the configuration of the control relating to distortion compensation using a reference signal can be made efficient; specifically, electric power consumption can be reduced and the characteristics of the amplified signal improved.

Various levels can be used as the level of the signal to be amplified; for example, amplitude level or power level or the like may be used.

Effecting non-combination of the reference signal with the signal to be amplified means the reference signal is not combined with the signal to be amplified.

As the way of effecting non-combination of the reference signal with the signal to be amplified, for example, a way may be used in which there is non-generation of the reference signal, that is, stopping the reference signal from being generated, or a way in which the reference signal is generated but said reference signal is not combined with the signal to be amplified.

The amplification apparatus of this invention performs the following processing in detecting distortion components contained in a signal to be amplified that is amplified by an amplifier, removing distortion components from the amplified signal in a distortion removal loop, using distortion components detected by a distortion detection loop, combining a reference signal with the signal to be amplified and using the reference signal to perform control relating to distortion compensation, when a burst signal, for example, is input as the signal to be amplified.

That is, an amplification signal level detection means detects the level of the signal to be amplified, and when the level detected by the amplification signal level detection means is less than a prescribed threshold value or is equal to or less than a prescribed threshold value, the reference signal control means effects control to have no reference signal output (that is, output does not take place).

Therefore when, for example, the level of a signal to be amplified is relatively low and the burst signal to be amplified is determined to be a no input state (that is, a state of no input taking place), since control is performed to effect no output of a reference signal, that is, when there is no need for a reference signal due to the burst signal to be amplified constituting a no input state, there is no insertion of a reference signal into a signal to be amplified, thereby enabling efficiency with respect to a control configuration relating to distortion compensation using a reference signal. Specifically, for example, electric power consumption can be reduced and the characteristics of the amplified signal improved.

As the prescribed threshold value used here with respect to the level of the signal to be amplified, various values may be used according to the operating condition of the apparatus, for example.

The reference signal control means can also use a mode of control to output a reference signal and combine the reference signal with the a signal to be amplified in, for example, cases other than when the level of the signal to be amplified is less than a prescribed threshold value or is equal to or less than a prescribed threshold value, that is, when the level of the signal to be amplified is equal to or greater than a prescribed threshold value or exceeds a prescribed threshold value.

Also, as the mode of prescribed control performed by the reference signal control means when the level of the signal to be amplified is less than a prescribed threshold value or is equal to or less than the prescribed threshold value, for example, a mode may be used in which the prescribed control is performed when said level is less than the prescribed threshold value, or a mode may be used in which the prescribed control is performed when said level is equal to or less than the prescribed threshold value. That is to say, whether or not the reference signal control means effects control to effect non-combination of a reference signal with a signal to be amplified by not outputting a reference signal, with respect to when the level detected by the amplification signal level detection means is equal to a prescribed threshold value, may be arbitrary.

The amplification apparatus according to the present invention is equipped with a reference signal generation circuit having a reference signal generation function and a switch to stop reference signal output. Putting the reference signal generation circuit switch into an Off state causes the means for controlling the reference signal (reference signal control means) to put the reference signal output into a stop state.

Thus, the switch provided in the reference signal generation circuit can be used to perform the control of stopping the output of the reference signal and effecting non-combination of the reference signal with the signal to be amplified.

Here, various configurations may be used for the reference signal generation circuit.

Also, various types of switch may be used, such as, for example, one that does not pass a signal when in the Off state and passes a signal when in the On state.

Also, various positions may be used as the position at which the switch is provided.

Further examples of the configuration of the present invention are described below.

In an example of one configuration, the amplification apparatus according to the present invention comprises a no-input-signal detection means that detects that a signal to be amplified is a no-input-signal, and a reference signal control means that performs control to effect non-combination of the reference signal with the signal to be amplified when the no-input-signal detection means detects that the signal to be amplified is a no-input-signal.

That is, when the signal to be amplified is a no-input-signal, the no-input-signal detection means detects that the signal to be amplified is a no-input-signal. Then, when it has been detected by the no-input-signal detection means that the signal to be amplified is a no-input-signal, control is performed by the reference signal control means to effect non-combination of the reference signal with the signal to be amplified.

Therefore when the signal to be amplified is a no-input-signal and control is performed to effect non-combination of the reference signal with the signal to be amplified, which is to say, when the reference signal is not needed due to the signal to be amplified being a no-input-signal, a reference signal is not inserted into the signal to be amplified, enabling the configuration of the control relating to distortion compensation using a reference signal to be made efficient; specifically, enabling electric power consumption to be reduced and the characteristics of the amplified signal to be improved.

In addition, when a plurality of reference signals is used, whether or not control is performed by the reference signal control means may be set for each of the reference signals. For example, a mode may be used in which the reference signal control means effects non-combination of any reference signal with a signal to be amplified, or a mode may be used in which the reference signal control means effects non-combination of just some prescribed reference signals.

In an example of one configuration of the amplification apparatus of this invention, the amplification signal level detection means detects the level of the signal to be amplified, and when the level detected by the amplification signal level detection means is less than a prescribed threshold value or is equal to or less than a prescribed threshold value, the reference signal control means performs control to effect non-combination of reference signals with a signal to be amplified.

In an example of one configuration, the amplification apparatus of this invention is equipped with a reference signal generation circuit that generates reference signals. By putting a switch provided at the output end of the reference signal generation circuit into an Off state, the reference signal control means effects a state of non-combination of a reference signal with a signal to be amplified by, for example, there being no output of a reference signal.

Therefore, it is possible to perform control to effect non-combination of the reference signal with a signal to be amplified by means of the switch provided on the output end of the reference signal generation circuit.

Here, the switch may be connected directly to the output end of the reference signal generation circuit, for example, or may be indirectly connected to the output end of the reference signal generation circuit via another circuit element.

In an example of one configuration, the amplification apparatus of this invention is equipped with a reference signal generation circuit constituted using an amplification unit that generates reference signals. By putting a switch provided on the power supply line of the amplification unit constituting the reference signal generation circuit into an Off state, the reference signal control means effects a state of non-combination of a reference signal with a signal to be amplified by, for example, there being no output of a reference signal.

Therefore, it is possible to perform control to effect non-combination of the reference signal with a signal to be amplified by means of the switch provided on the power supply line of the amplification unit constituting the reference signal generation circuit.

Here, various configurations can be used for the reference signal generation circuit constituted with an amplification unit.

Also, various types of switch may be used, such as, for example, one that does not pass a power supply signal when in the Off state and passes a power supply signal when in the On state.

The switch may be connected directly to the input end of the amplification unit power supply, for example, or may be indirectly connected to the input end of the amplification unit power supply via another circuit element.

In an example of one configuration, the amplification apparatus of this invention is equipped with a reference signal generation circuit that generates reference signals constituted of a PLL or VCO or both. By putting a switch provided on the power supply line of the PLL or VCO or both constituting the reference signal generation circuit, the reference signal control means effects a state of non-combination of a reference signal with a signal to be amplified by, for example, there being no output of a reference signal.

Therefore, it is possible to perform control to effect non-combination of the reference signal with a signal to be amplified by means of the switch provided on the power supply line of the PLL or VCO constituting the reference signal generation circuit.

Here, various configurations can be used for the reference signal generation circuit. For example, a configuration can be used having just one of either a PLL or a VCO, or a configuration can be used having both a PLL and a VCO.

Also, when the reference signal generation circuit is constituted with both a PLL and a VCO, control by the reference signal control means can be effected using a switch provided on just one of either the PLL or VCO, or control by the reference signal control means can be effected using switches provided individually or in common with respect to both the PLL and the VCO.

Also, various types of switch may be used, such as, for example, one that does not pass a power supply signal when in the Off state and passes a power supply signal when in the On state.

Also, the switch may be connected directly to the input end of the PLL or VCO power supply, for example, or may be indirectly connected to the input end of the PLL or VCO power supply via another circuit element.

Further examples of the configuration of the present invention are described below.

In an example of one configuration of the amplification apparatus according to this invention, the reference signal control means can switch between a state in which a reference signal is combined with a signal to be amplified, and a state of non-combination of a reference signal with a signal to be amplified.

In an example of one configuration of the amplification apparatus according to this invention, the On-Off switching of a switch is used to switch the reference signal control means between a state in which a reference signal is combined with a signal to be amplified, and a state of non-combination of a reference signal with a signal to be amplified.

In addition, for example, with respect to the state in which the reference signal is combined with the signal to be amplified and the state of non-combination of the reference signal with the signal to be amplified, a mode may be used whereby the reference signal control means is switched to each state by means of a control operation corresponding to each state, or a mode may be used whereby, when there is no particular control operation taking place, it stays in one state, is switched to the other state by a control operation corresponding to the other state, and is switched to the first state by stopping said control operation.

The following configuration is used as an example of a configuration of the amplification apparatus according to this invention.

A distortion detection loop uses dividing means to divide a signal to be amplified, amplifies one divided signal with an amplifier, combines the amplified signal with another divided signal, and detects the result of said combination as a signal containing the distortion component contained in the amplified signal (distortion component signal).

A reference signal combining means combines the reference signal (here called the first reference signal) with the signal to be amplified prior to the division by the dividing means. Then, a distortion compensation processing control means controls the processing relating to distortion compensation in the distortion detection loop to reduce the level of the first reference signal contained in the signal (distortion signal) detected by the distortion detection loop.

As the processing relating to distortion compensation in the distortion detection loop, for example, processing is used that changes one or both of the amplitude and phase of one of the divided signals.

Here, various means may be used as the dividing means. For example, a splitter or wiring or the like that divides the signal can be used.

Also, as the result of combining the amplified signal with the other divided signal in the distortion detection loop, with respect to the components of the signal to be amplified (and the first reference signal), for example, there may be used a result of combining that mutually cancels out components contained in said amplified signal and components contained in said other divided signal. This combination result contains the distortion components generated by the amplifier.

Also, as the mode for reducing the level of the first reference signal contained in the signal (distortion component signal) detected by the distortion detection loop, for example, there may be used a mode that minimizes said level, or a mode or the like that brings the level down to less than a prescribed threshold value level (or to the same as or less than a prescribed threshold value level).

Moreover, in this configuration, when the level of the first reference signal contained in the signal (distortion component signal) detected by the distortion detection loop decreases, the level of the distortion component contained in the signal to be amplified decreases, which can be regarded as improving the distortion component detection accuracy.

Also, the processing for changing the signal amplitude can, for example, be done using a variable attenuator that can attenuate the amplitude of the signal by a variable attenuation amount, or a variable amplifier that can increase the amplitude of the signal by a variable amplification amount.

Also, the processing for changing the signal phase can, for example, be done using a variable phase shifter that can change the signal phase by a variable change amount.

Also, a vector adjuster, for example, can be used that is able to change the signal amplitude and phase by a variable amplitude change amount and a variable phase shift amount.

The following configuration is used as an example of a configuration of the amplification apparatus according to this invention.

A reference signal combining means combines the reference signal (here called the second reference signal) with the signal to be amplified prior to the division by the dividing means. Then, a distortion compensation processing control means controls the processing relating to distortion compensation in a distortion removal loop to reduce the level of the second reference signal contained in the amplified signal after distortion removal by the distortion removal loop.

As the processing relating to distortion compensation in the distortion removal loop, for example, processing is used that changes one or both of the amplitude and phase of a signal (distortion component signal) detected by the distortion detection loop.

Also, as the mode for reducing the level of the second reference signal contained in the amplified signal after distortion removal by the distortion detection loop, for example, there may be used a mode that minimizes said level, or a mode or the like that brings the level down to less than a prescribed threshold value level (or to the same as or less than a prescribed threshold value level).

Moreover, in this configuration, when the level of the second reference signal contained in the amplified signal after distortion removal by the distortion detection loop decreases, the level of the distortion component contained in the signal to be amplified after said distortion removal decreases, which can be regarded as improving the distortion component removal accuracy.

The amplification apparatus of this invention can be provided, for example, in a wireless or wired communication system, communication apparatus, transmitter, transceiver. As a specific example, it can be provided in a mobile communication system, base station unit or relay station unit and applied to a common amplification apparatus and the like that amplifies multicarrier signals, for example.

A signal to be transmitted, for example, may be used as the signal to be amplified by the amplification apparatus of this invention.

Here, various systems may be used as the communication system, such as, for example, a cellular phone system, a Personal Handy phone System (PHS) or other such mobile communication system, or a subscriber wireless access system such as what is called a Fixed Wireless Access (FWA) or the like may be used.

Also, various communication methods may be used, such as for example the Code Division Multiple Access (CDMA) method or Wide-band (W)-CDMA method, the Time Division Multiple Access (TDMA) method and the Frequency Division Multiple Access (FDMA) method.

In addition, the technical concept of the invention can be applied to various types of control relating to combining reference signals with signals to be amplified and distortion compensation using the reference signals, when compensating for distortion generated in an amplifier, for example.

BEST MODE FOR CARRYING OUT THE INVENTION

Embodiments of the present invention will now be described with reference to the drawings.

This embodiment shows a case in which the present invention is applied to an amplification apparatus that performs distortion compensation by a feedforward method that uses a compensation method to cancel a signal. Also, when the amplification apparatus according to this embodiment is provided in a base station unit or relay station unit of a wireless communication system and a signal to be transmitted to a mobile station unit or the like is amplified by an amplifier, it compensates for distortion generated by the amplifier, and uses a pilot signal constituting a reference signal to effect control relating to the distortion compensation.

An amplification apparatus according to a first embodiment will now be described.

Figure 1:
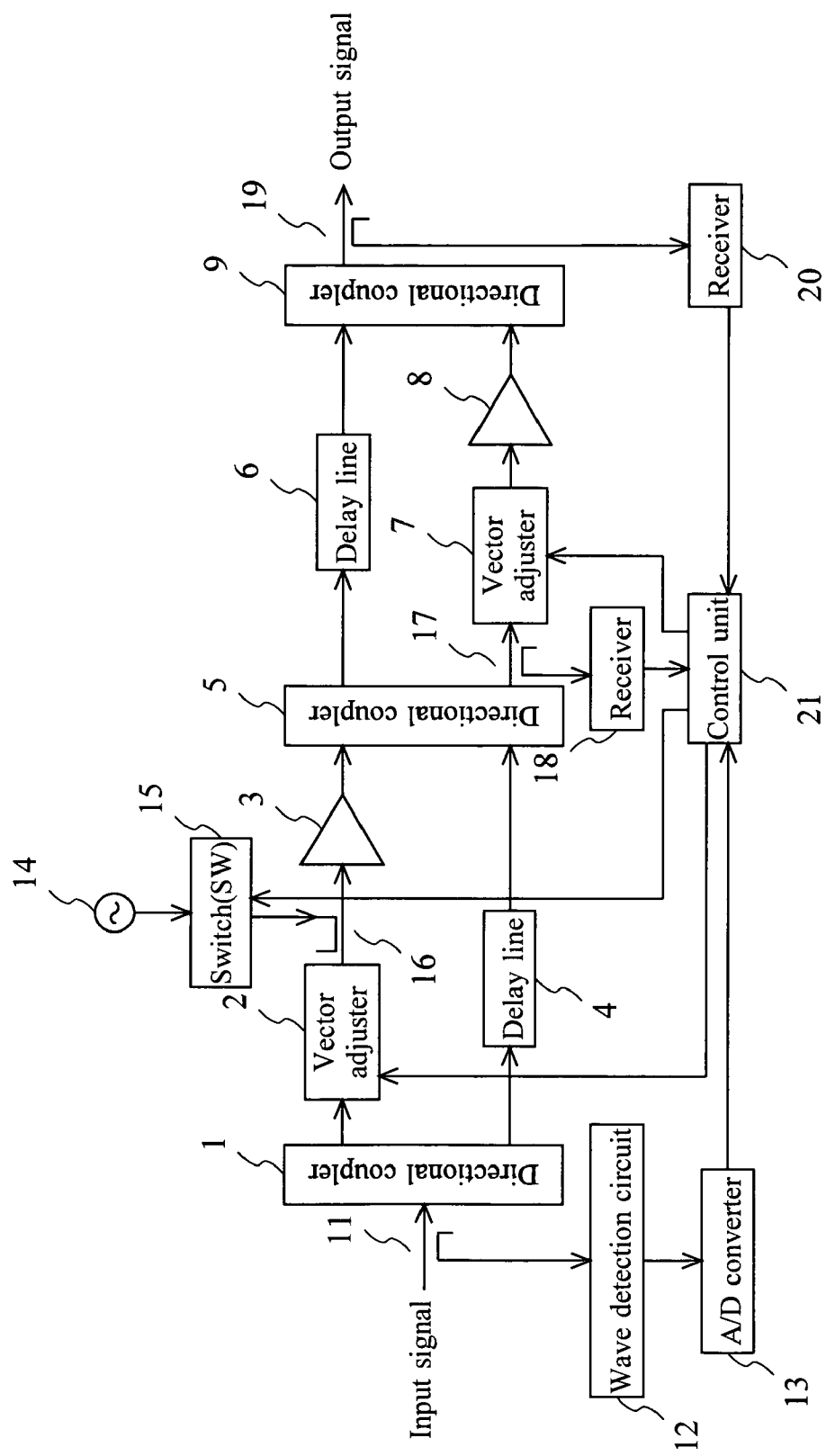
FIG. 1 is a diagram showing an example of a configuration of an amplification apparatus according to a first embodiment of the present invention.

FIG. 1 shows an example of the configuration of the amplification apparatus of this embodiment.

The amplification apparatus of this embodiment comprises a first directional coupler 1, a first vector adjuster 2, a main amplifier 3, a first delay line 4, a second directional coupler 5, a second delay line 6, a second vector adjuster 7, an auxiliary amplifier (error amplifier) 8 and a third directional coupler 9.

Here, a distortion detection loop is constituted by the functions of the first directional coupler 1, first vector adjuster 2, main amplifier 3, first delay line 4 and second directional coupler 5.

Also, a distortion removal loop is constituted by the functions of the second delay line 6, second vector adjuster 7, auxiliary amplifier 8 and third directional coupler 9.

The amplification apparatus of this embodiment is also equipped with a coupler 11, a wave detection circuit 12, an A/D (Analog to Digital) converter 13; the functions of these constitute a functional portion that detects the level of an input signal.

The amplification apparatus of this embodiment is also equipped with an oscillator 14, a switch (SW) and a coupler 16; the functions of these constitute a functional portion that combines a pilot signal (test signal) with the input signal.

The amplification apparatus of this embodiment is also equipped with a coupler 17 and a receiver 18; the functions of these constitute a functional portion that acquires information relating to distortion component signals detected by the distortion detection loop.

The amplification apparatus of this embodiment is also equipped with a coupler 19 and a receiver 20; the functions of these constitute a functional portion that acquires information relating to an amplified signal after distortion removal by the distortion removal loop.

The amplification apparatus of this embodiment is also equipped with a control unit 21, the functions of which constitute a functional portion that performs various processing and control in this amplification apparatus.

An example of operations performed by the amplification apparatus of this embodiment will now be described.

An example of the operation of the distortion detection loop will now be described.

A signal input to the amplification apparatus of this embodiment (input signal) is input to the first directional coupler 1.

The first directional coupler 1 divides the input signal into two and outputs one of the divided signals to the first vector adjuster 2 and outputs the other divided signal to the first delay line 4.

The first vector adjuster 2 performs vector adjustment of the amplitude or phase of the first divided signal, and after the vector adjustment, outputs the signal to the main amplifier 3.

The main amplifier 3 amplifies the signal input from the first vector adjuster 2 and outputs the amplified signal to the second directional coupler 5. Here, distortion is generated when the main amplifier 3 amplifies the signal.

The first delay line 4 delays the other divided signal and outputs it to the second directional coupler 5.

The second directional coupler 5 divides the amplified signal input from the main amplifier 3, and outputs one of the divided amplified signals to the second delay line 6, and outputs the result of combining (coupling) the other divided amplified signal with the signal input from the first delay line 4, as a distortion component signal, to the second vector adjuster 7.

With respect to the signal combination in the second directional coupler 5, for example, the control unit 21 controls the amount of vector adjustment by the first vector adjuster 2 so that the other amplified signal and the signal from the first delay line 4 are combined at the same amplitude and opposite phase (phase difference of 180 degrees) with respect to the input signal, which is to say, so that the input signal components contained in the other divided amplified signal and the input signal components contained in the signal from the first delay line 4 cancel each other out.

An example of the operation of the distortion removal loop will now be described.

The second delay line 6 delays the amplified signal input from the second directional coupler 5, and outputs it to the third directional coupler 9.

The second vector adjuster 7 performs vector adjustment of the distortion component signal input from the second directional coupler 5, and outputs the vector-adjusted distortion component signal to the auxiliary amplifier 8.

The auxiliary amplifier 8 amplifies the distortion component signal input from the second vector adjuster 7 and outputs it to the third directional coupler 9.

The result of combining (coupling) the amplified signal input from the second delay line 6 and the distortion component signal input from the auxiliary amplifier 8 is output by the third directional coupler 9 as an amplified signal after distortion removal. This amplified signal after distortion removal forms the signal that is output (output signal) from the amplification apparatus of this embodiment.

With respect to the signal combination in the third directional coupler 9, for example, the control unit 21 controls the amount of vector adjustment by the second vector adjuster 7 so that the amplified signal from the second delay line 6 and the distortion component signal from the auxiliary amplifier 8 are combined at the same amplitude and opposite phase (phase difference of 180 degrees) with respect to the distortion component, that is, so that the input signal components contained in the other amplified signal from the second delay line 6 and the distortion components contained in the distortion component signal from the auxiliary amplifier 8 cancel each other out.

An example of the operations that control the distortion compensation performed by the distortion detection loop and distortion removal loop will now be described.

The coupler 11 acquires a portion of a signal that is input (input signal) to the first directional coupler 1 and outputs it to the wave detection circuit 12.

The wave detection circuit 12 detects the signal input from the coupler 11 and outputs an analog signal representing the level of the input signal thus obtained to the A/D converter 13.

The A/D converter 13 converts the analog signal input from the wave detection circuit 12 to a digital signal and outputs it to the control unit 21. The digital signal represents the input signal level value.

The oscillator 14 generates a prescribed pilot signal and outputs it to the switch 15.

Under the control of the control unit 21, the switch 15 switches to an On state or an Off state. In the On state a pilot signal input from the oscillator 14 is output to the coupler 16; in the Off state, a pilot signal input from the oscillator 14 is not output to the coupler 16.

When the pilot signal from the switch 15 is input to the coupler 16, the pilot signal is combined (coupled) with a signal transmitted from the first vector adjuster 2 to the main amplifier 3. In this case, the signal in which the signal from the first vector adjuster 2 and the pilot signal are combined is input to the main amplifier 3.

The coupler 17 acquires a portion of the distortion component signal transmitted from the second directional coupler 5 to the second vector adjuster 7 and outputs it to the receiver 18.

The receiver 18 receives the signal input from the coupler 17 and outputs the reception result to the control unit 21.

The coupler 19 acquires a portion of the amplified signal after distortion removal output from the third directional coupler 9, and outputs it to the receiver 20.

The receiver 20, for example, receives the pilot signal component contained in the signal input from the coupler 19, and outputs the reception result to the control unit 21.

Based on the reception result input from the receiver 18, for example, the control unit 21 controls the first vector adjuster 2 of the distortion detection loop to minimize the distortion component signal detected by the second directional coupler 5, that is, to minimize the input signal components contained in the distortion component signal.

Based on the reception result input from the receiver 20, for example, the control unit 21 controls the second vector adjuster 7 of the distortion removal loop to minimize the pilot signal component contained in the amplified signal after distortion removal output from the third directional coupler 9, that is, to minimize the distortion components contained in the amplified signal after distortion removal.

Also, the control unit 21 controls the On-Off state of the switch 15 based on the information on the level value of the input signal input from the A/D converter 13. Specifically, the switch 15 is controlled to be in the On state when an input signal is being input, and to be in the Off state when an input signal is not being input.

With respect to the timing of the switching of the On-Off states of the switch 15, various timings may be used that are effective from a practical standpoint. As one example, a mode may be used in which, when the signal transmitted from the first vector adjuster 2 to the main amplifier 3 includes an input signal forming the signal to be amplified, the switch 15 is switched to the On state and the pilot signal combined with the signal, and when the signal transmitted from the first vector adjuster 2 to the main amplifier 3 does not include an input signal forming the signal to be amplified, the switch 15 is switched to the Off state and the pilot signal not combined with the signal.

As described above, the amplification apparatus of this embodiment is equipped with a distortion detection loop and a distortion removal loop and uses a configuration that, with at least one pilot signal being input, effects control to minimize the level of the pilot signal based on a pilot signal detection result, wherein the presence or absence of an input signal is determined based on a detection result obtained by means of the wave detection circuit 12 that detects input signals and the A/D converter 13 that converts the level values of detected input signals into digital signals, and the switch 15 is controlled so that a pilot signal is not output when an input signal is not being input.

With this amplification apparatus, therefore, since a pilot signal is not output when it is not needed due to the non-existence of an input signal constituting a signal to be amplified, is possible to achieve stable distortion compensation operation, ensure the distortion compensation amount, achieve wideband distortion compensation operation, improve the characteristics of amplified signals, and reduce electric power consumption.

In addition, in this amplification apparatus, the amplifier that is subject to the distortion compensation is constituted by the main amplifier 3; the reference signal (second reference signal) is constituted by the pilot signal output from the oscillator 14; the reference signal combining means (second reference signal combining means) is constituted by the functions of the coupler 16; and the distortion compensation processing control means (second distortion compensation processing control means) is constituted by the functions of the control unit 21 that control the second vector adjuster 7.

In this amplification apparatus, also, the amplification signal detection means is constituted by the functions of the wave detection circuit 12, A/D converter 13 and control unit 21; the no-input-signal detection means is constituted by the function of the control unit 21 that detects a no input state based on the detection result obtained by means of the wave detection circuit 12 and A/D converter 13; and the reference signal control means is constituted by the function of the control unit 21 that controls the switch 15 to effect non-combination of the signal to be amplified and the pilot signal.

An amplification apparatus according to a second embodiment will now be described.

Figure 2:
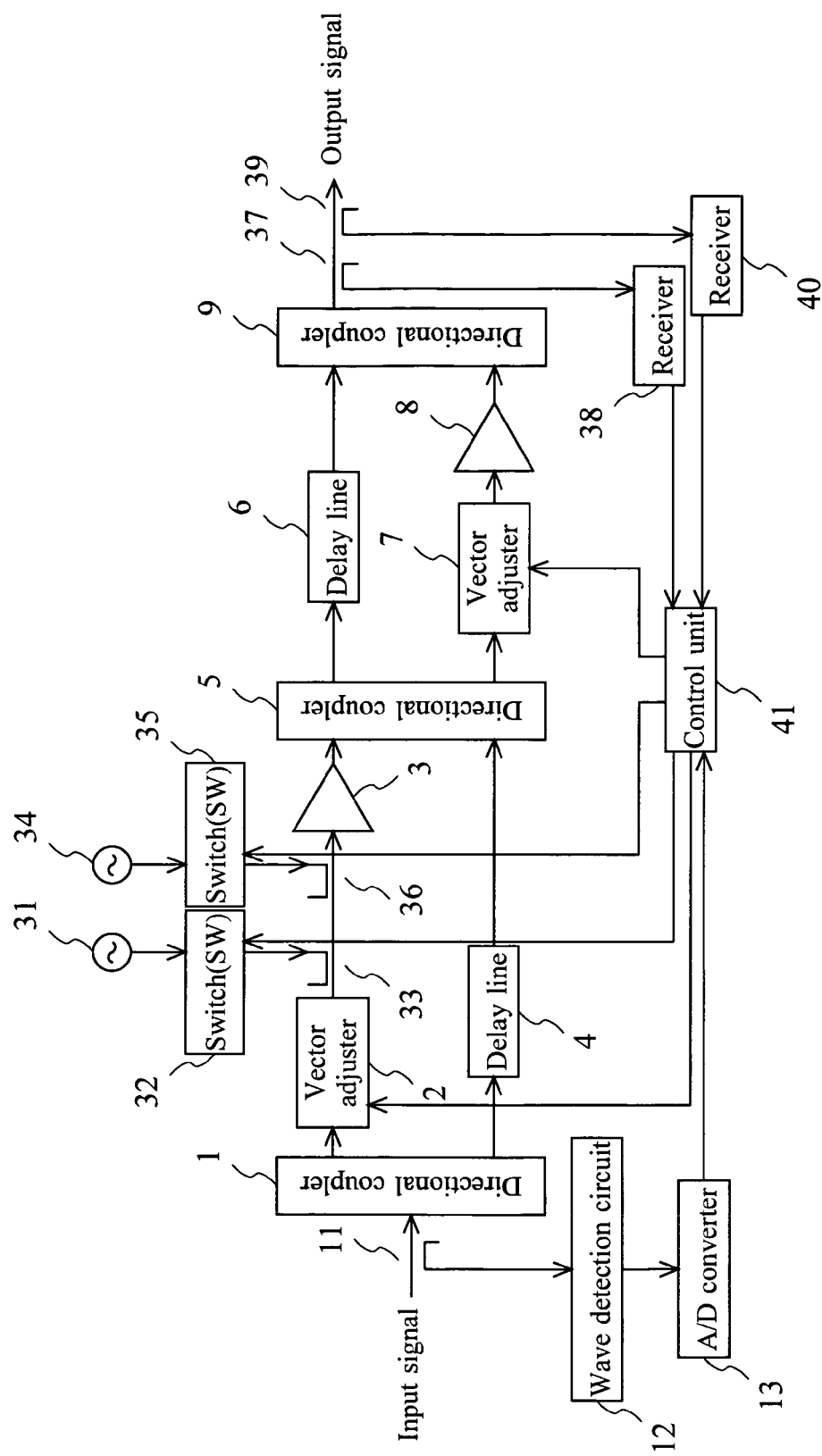
FIG. 2 is a diagram showing an example of a configuration of an amplification apparatus according to a second embodiment of the present invention.

FIG. 2 shows an example of the configuration of the amplification apparatus of this embodiment.

The amplification apparatus of this embodiment comprises processing units 1~9 constituting a distortion detection loop and distortion removal loop, a coupler 11, a wave detection circuit 12, and an A/D converter 13. Here, the constitution and operations of each of the processing units 1~9 and 11~13 are the same as in the case of the amplification apparatus of the first embodiment, for example, shown in FIG. 1, and use the same symbols, and a detailed description is omitted.

The amplification apparatus of this embodiment uses two pilot signals (below, called pilot signal A and pilot signal B) having mutually different frequencies.

Specifically, the amplification apparatus of this embodiment is equipped with an oscillator 31, a switch (SW) 32 and a coupler 33; the functions of these constitute a functional unit that combines pilot signal A with an input signal.

Similarly, the amplification apparatus of this embodiment is equipped with an oscillator 34, a switch (SW) 35 and a coupler 36; the functions of these constitute a functional unit that combines pilot signal B with an input signal.

The amplification apparatus of this embodiment is also equipped with a coupler 37 and a receiver 38; the functions of these constitute a functional unit that, with respect to pilot signal A, acquires information relating to an amplified signal after distortion removal by the distortion removal loop.

Similarly, the amplification apparatus of this embodiment is also equipped with a coupler 39 and a receiver 40; the functions of these constitute a functional unit that, with respect to pilot signal B, acquires information relating to an amplified signal after distortion removal by the distortion removal loop.

The amplification apparatus of this embodiment is also equipped with a control unit 41, the functions of which constitute a functional unit that controls various processes in the amplification apparatus of the embodiment.

An example of operations performed by the amplification apparatus of this embodiment will now be described.

For simplicity, explanations relating to operating parts that are the same as in the case of the amplification apparatus of the above first embodiment shown in FIG. 1 are omitted.

The oscillator 31 generates a prescribed pilot signal A, the switch 32 is switched to an On state or an Off state in accordance with the control of the control unit 41, and when a pilot signal A is input from the switch 32, the coupler 33 combines the pilot signal A with a signal transmitted from the first vector adjuster 2 to the main amplifier 3.

Similarly, the oscillator 34 generates a prescribed pilot signal B, the switch 35 is switched to an On state or an Off state in accordance with the control of the control unit 41, and when a pilot signal B is input from the switch 35, the coupler 36 combines the pilot signal B with a signal transmitted from the first vector adjuster 2 to the main amplifier 3.

The coupler 37 acquires a portion of the amplified signal output from the third directional coupler 9 after distortion removal, and the receiver 38 receives the pilot signal A component contained in the signal input from the coupler 37, and outputs the reception result to the control unit 41.

Similarly, the coupler 39 acquires a portion of the amplified signal output from the third directional coupler 9 after distortion removal, and the receiver 40 receives the pilot signal B component contained in the signal input from the coupler 39, and outputs the reception result to the control unit 41.

The control unit 41 controls the first vector adjuster 2 of the distortion detection loop to improve the accuracy of distortion detection by the distortion detection loop.

Also, the control unit 41 controls the second vector adjuster 7 of the distortion removal loop to improve the accuracy of distortion removal by the distortion removal loop.

The control unit 41 also controls the On-Off states of the two switches 32 and 35, based on the information on the level value of the input signal input from the A/D converter 13. Specifically, the two switches 32 and 35 are controlled to be in the On state when an input signal is being input, and to be in the Off state when an input signal is not being input.

As described in the above, with the amplification apparatus of this embodiment, the same effect as that shown in the above first embodiment can also be obtained when a plurality of pilot signals (pilot signals A and B) is used to control the distortion compensation processing in the distortion removal loop.

In addition, in the amplification apparatus of this embodiment, a reference signal (second reference signal) is constituted by pilot signals A, B output from the oscillator 31 and oscillator 34; the reference signal combining means (second reference signal combining means) is constituted by the functions of the coupler 33 and the functions of the coupler 36; and the distortion compensation processing control means (second distortion compensation processing control means) is constituted by the functions of the control unit 21 that control the second vector adjuster 7.

In this amplification apparatus, also, the reference signal control means is constituted by the functions of the control unit 41 that control each of the switches 32 and 35 to effect non-combination of each of the pilot signals A, B with a signal to be amplified.

An amplification apparatus according to a third embodiment will now be described.

Figure 3:
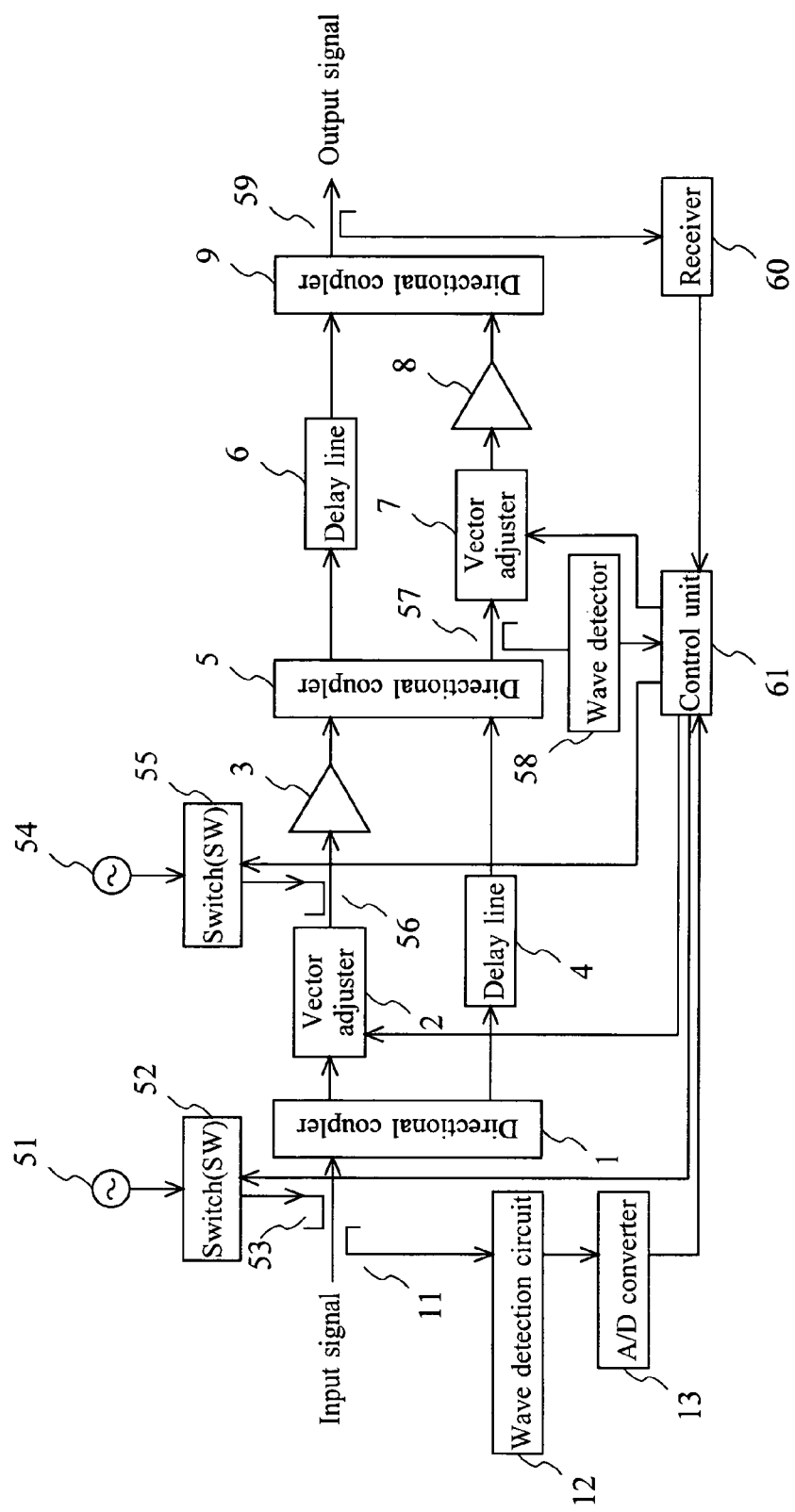
FIG. 3 is a diagram showing an example of a configuration of an amplification apparatus according to a third embodiment of the present invention.

FIG. 3 shows an example of the configuration of the amplification apparatus of this embodiment.

The amplification apparatus of this embodiment comprises processing units 1~9 constituting a distortion detection loop and distortion removal loop, a coupler 11, a wave detection circuit 12, and an A/D converter 13. Here, the constitution and operations of each of the processing units 1~9 and 11~13 are the same as in the case of the amplification apparatus of the first embodiment, for example, shown in FIG. 1, and use the same symbols, and a detailed description is omitted.

The amplification apparatus of this embodiment uses two pilot signals having mutually different frequencies: a pilot signal used for control in the distortion detection loop (below, called first pilot signal), and a pilot signal used for control in the distortion removal loop (second pilot signal).

In this embodiment, the frequency of the first pilot signal is set at a frequency location that is slightly separated from the frequency band of the original signal (input signal), and the frequency of the second pilot signal is set at a frequency location that, of the distortion components generated by the main amplifier 3, is located in the spaces of frequencies occupied by the original signal (input signal), or outside the frequency band of the original signal (input signal).

Specifically, the amplification apparatus of this embodiment is equipped with an oscillator 51, a switch 52 and a coupler 53; the functions of these constitute a functional unit that combines the first pilot signal with an input signal.

The amplification apparatus is also equipped with an oscillator 54, a switch (SW) 55 and a coupler 56; the functions of these constitute a functional unit that combines the second pilot signal with an input signal.

The amplification apparatus is also equipped with a coupler 57 and a wave detector 58; the functions of these constitute a functional unit that acquires information relating to a distortion component signal detected by the distortion detection loop.

The amplification apparatus is also equipped with a coupler 59 and a receiver 60; the functions of these constitute a functional unit that acquires information relating to an amplified signal after distortion removal by the distortion removal loop.

The amplification apparatus is also equipped with a control unit 61, the functions of which constitute a functional unit that controls various processes in the amplification apparatus of the embodiment.

An example of operations performed by the amplification apparatus of this embodiment will now be described.

For simplicity, explanations relating to operating parts that are the same as in the case of the amplification apparatus of the above first embodiment shown in FIG. 1 are omitted.

The oscillator 51 generates a first pilot signal, and the switch 52 is switched to an On state or an Off state in accordance with the control of the control unit 61.

When the switch 52 is in the On state and a first pilot signal is input from the switch 52, the coupler 53 combines the first pilot signal with the input signal prior to input to the first directional coupler 1. In this case, the signal constituted by the input signal combined with the first pilot signal is input to the first directional coupler 1.

The oscillator 54 generates a second pilot signal, and the switch 55 is switched to an On state or an Off state in accordance with the control of the control unit 61. When a second pilot signal is input from the switch 55, the coupler 56 combines the second pilot signal with a signal transmitted from the first vector adjuster 2 to the main amplifier 3.

The coupler 57 acquires a portion of the distortion component signal transmitted from the second directional coupler 5 to the second vector adjuster 7, and outputs it to the wave detector 58.

The wave detector 58 detects the first pilot signal component contained in the signal input from the coupler 57 and outputs the reception result to the control unit 61.

The coupler 59 acquires a portion of the amplified signal output from the third directional coupler 9 after distortion removal, and the receiver 60 receives the second pilot signal component contained in the signal input from the coupler 59, and outputs the reception result to the control unit 61.

Based on the detection result input from the wave detector 58, for example, the control unit 61 controls the first vector adjuster 2 of the distortion detection loop to minimize the first pilot signal component contained in the distortion component signal detected by the second directional coupler 5, that is, to minimize the input signal components contained in the distortion component signal.

Based on the reception result input from the receiver 60, for example, the control unit 61 controls the second vector adjuster 7 of the distortion removal loop to improve the accuracy of the distortion removal by the distortion removal loop.

Also, the control unit 61 controls the On-Off state of the two switches 52 and 55 based on the information on the level value of the input signal input from the A/D converter 13. Specifically, the two switches 52 and 55 are controlled to be in the On state when an input signal is being input, and to be in the Off state when an input signal is not being input.

As described in the above, with the amplification apparatus of this embodiment, the same effect as that shown in the above first embodiment can also be obtained using a pilot signal (first pilot signal) to control the distortion compensation processing in the distortion removal loop, and using a pilot signal (second pilot signal) for control in the distortion removal loop (second pilot signal).

In addition, in the amplification apparatus of this embodiment, the first reference signal is constituted by the first pilot signal output from the oscillator 51; the second reference signal is constituted by the second pilot signal output from the oscillator 54; the first reference signal combining means is constituted by the functions of the coupler 53; the second reference signal combining means is constituted by the functions of the coupler 56; the first distortion compensation processing control means is constituted by the functions of the control unit 61 that control the first vector adjuster 2; and the second distortion compensation processing control means is constituted by the functions of the control unit 61 that control the second vector adjuster 7.

In this amplification apparatus, also, the reference signal control means is constituted by the functions of the control unit 41 that control each of the switches 52 and 55 to effect non-combination of each of the pilot signals with a signal to be amplified.

An amplification apparatus according to a fourth embodiment will now be described.

Figure 4:
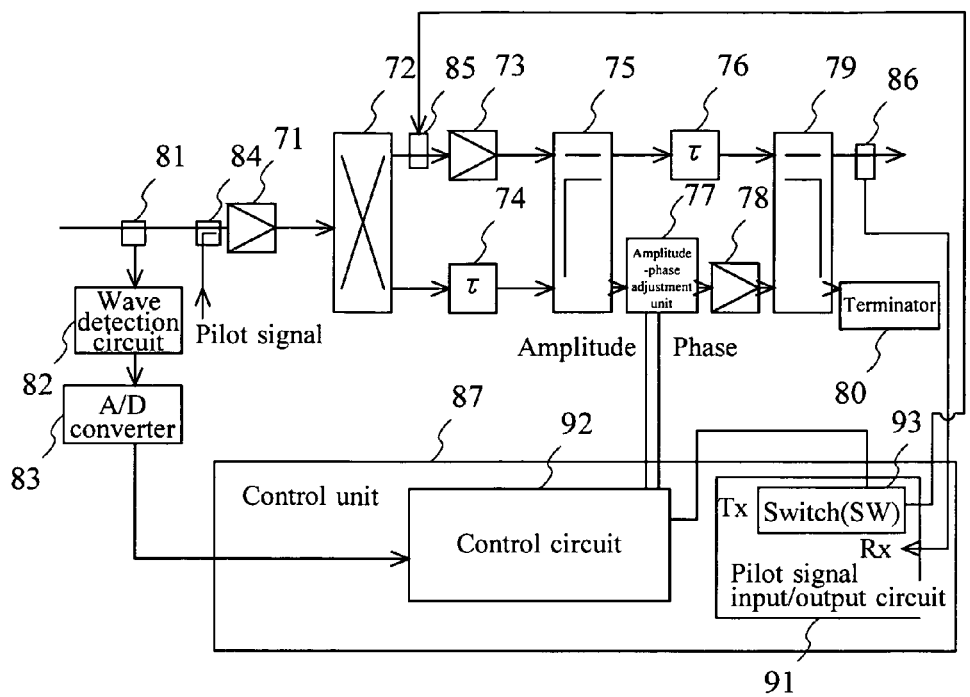
FIG. 4 is a diagram showing an example of a configuration of an amplification apparatus according to a fourth embodiment of the present invention.

FIG. 4 shows an example of the configuration of the amplification apparatus of this embodiment.

The amplification apparatus of this embodiment is equipped with a pre-amplifier 71, a first directional coupler 72, a main amplifier 73, a first delay line (delay route) 74, a second directional coupler 75, a second delay line (delay route) 76, an amplitude-phase adjustment unit 77, an auxiliary amplifier (error amplifier) 78, a third directional coupler 79 and a terminator 80.

Here, the distortion detection loop is constituted by the functions of the pre-amplifier 71, first directional coupler 72, main amplifier 73, first delay line 74 and second directional coupler 75.

Also, the distortion removal loop is constituted by the amplitude-phase adjustment unit 77, auxiliary amplifier 78, third directional coupler 79 and terminator 80.

The amplification apparatus of this embodiment is also equipped with a coupler 81, a wave detection circuit 82 and an A/D converter 83; the functions of these constitute a functional unit that detects the level of input signals.

The amplification apparatus of this embodiment is also equipped with a coupler 84 for combining a first pilot signal with an input signal, and a coupler 85 for combining a second pilot signal with an input signal.

The amplification apparatus of this embodiment is also equipped with a control unit 87.

The control unit 87 is equipped with a pilot signal input/output circuit 91 and a control circuit 92.

The pilot signal input/output circuit 91 is equipped with a switch (SW) 93.

An example of operations performed by the amplification apparatus of this embodiment will now be described.

An example of the operations in the distortion detection loop will now be described.

Except for the provision of the pre-amplifier 71, for example, and the non-inclusion of a vector adjuster, the constitution and operation of the distortion detection loop of this embodiment is the same as in the case of the amplification apparatus of the first embodiment shown in FIG. 1, and a detailed description of the operations is omitted.

An example of the operations in the distortion removal loop will be described.

Except for the provision of the amplitude-phase adjustment unit 77 corresponding to a vector adjuster, for example, and the provision of the terminator 80, the constitution and operation of the distortion removal loop of this embodiment is the same as in the case of the amplification apparatus of the first embodiment shown in FIG. 1, and a detailed description of the operations is omitted.

An example of the control operations relating to the distortion compensation carried out by the distortion detection loop and distortion removal loop will be described.

The operation of the detection of the level of input signals using the coupler 81, the wave detection circuit 82 and the A/D converter 83 is the same as in the case of the amplification apparatus of the first embodiment shown in FIG. 1, and a detailed description of the operation is omitted. In addition, the A/D converter 83 outputs a digital signal representing the input signal level value to the control circuit 92 of the control unit 87.

The coupler 84 is provided after the coupler 81 and before the pre-amplifier 71, and is able to combine the first pilot signal with an input signal. In addition, while this embodiment shows an example of a configuration that can combine the first pilot signal with an input signal, this is not essential, and a configuration may also be used that does not enable the first pilot signal to be combined with the input signal.

Also, in order to explain a case in which the present invention is applied to a second pilot signal in this embodiment, more detailed explanation with respect to the first pilot signal is omitted.

When a second pilot signal is input from the switch 93 of the pilot signal input/output circuit 91, the coupler 85 combines the second pilot signal with a signal transmitted from the first directional coupler 72 to the main amplifier 73. In this case, the signal in which the signal output from the first directional coupler 72 and the second pilot signal are combined is input to the main amplifier 73.

The coupler 86 acquires a portion of the amplified signal output from the third directional coupler 79 after distortion removal, and outputs it to the pilot signal input/output circuit 91.

The pilot signal input/output circuit 91 has the function of receiving (Rx) a signal corresponding to the second pilot signal, receives the second pilot signal component contained in the signal input from the coupler 86, and outputs the reception result to the control circuit 92.

The pilot signal input/output circuit 91 also has the function of transmitting (Tx) a signal corresponding to the second pilot signal, and the On-Off state of the switch 93 is controlled by the control circuit 92 to switch between a state in which the second pilot signal output to the coupler 85 via the switch 93, and a state in which the second pilot signal is blocked by the switch 93 and not output to the coupler 85.

Based on the result of receiving the second pilot signal input from the pilot signal input/output circuit 91, for example, the control unit 92 controls the amplitude-phase adjustment unit 77 of the distortion removal loop to improve the accuracy of distortion removal by the distortion removal loop.

Also, the control unit 92 controls the On-Off state of the switch 93 of the pilot signal input/output circuit 91 based on the information on the level value of the input signal input from the A/D converter 83. Specifically, the switch 93 is controlled to be in the On state when an input signal is being input, and to be in the Off state when an input signal is not being input.

As described in the above, the same effect as that shown in the above first embodiment can also be obtained with the configuration of the amplification apparatus of this embodiment. Also, when a plurality of pilot signals is used, as in this embodiment, whether or not to perform switch-based On-Off control can be set for each of the pilot signals.

In addition, in this amplification apparatus, the amplifier that is subject to the distortion compensation is constituted by the main amplifier 73; the reference signal (second reference signal) is constituted by the second pilot signal output from the pilot signal input/output circuit 91; the reference signal combining means (second reference signal combining means) is constituted by the functions of the coupler 85; and the distortion compensation processing control means (second distortion compensation processing control means) is constituted by the functions of the control circuit 92 that control the amplitude-phase adjustment unit 77.

In this amplification apparatus, also, the amplification signal detection means is constituted by the functions of the wave detection circuit 82, A/D converter 83 and control circuit 92; the no-input-signal detection means is constituted by the function of the control unit 21 that detects a no input state based on the detection result obtained by means of the wave detection circuit 82 and A/D converter 83; and the reference signal control means is constituted by the function of the control circuit 92 that controls the switch 93 to effect non-combination of the signal to be amplified and the second pilot signal.

An amplification apparatus according to a fifth embodiment will now be described.

The circuit that generates pilot signals (pilot signal generation circuit) characterizes the constitution and operation of the amplification apparatus of this embodiment; the constitution and operation of other parts are the same as in the case of the amplification apparatus shown in the above first to fourth embodiments, so a detailed description is omitted.

Figure 5:
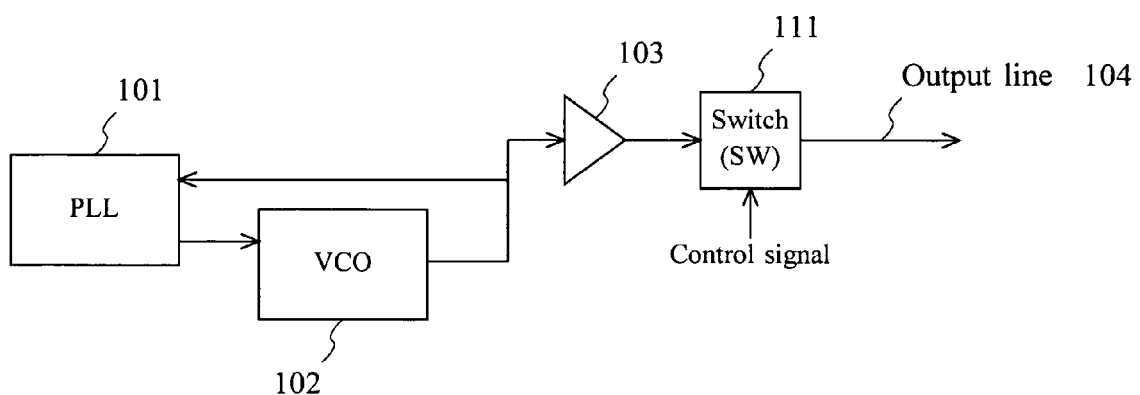
FIG. 5 is a diagram showing an example of the configuration of a pilot signal generation circuit according to a fifth embodiment of the present invention, configured with a SW provided in the output line.

FIG. 5 shows an example of the configuration of the pilot signal generation circuit of this embodiment.

The pilot signal generation circuit of this embodiment is comprised of a combination of a PLL (Phase Locked Loop) 101, a VCO (Voltage Controlled Oscillator) 102, an amplifier 103 and, for example, an RF (Radio Frequency) switch (SW) 111.

The switch 111 is provided connected to the output line 104 of the amplifier 103. The output line 104 of the amplifier 103 is connected to a coupler (such as, for example, the coupler 16 shown in FIG. 1, the couplers 33 and 36 shown in FIG. 2, the couplers 53 and 56 shown in FIG. 3, the coupler 85 shown in FIG. 4) for combining pilot signals with the signals to be amplified.

In the pilot signal generation circuit of this embodiment, the On-Off state of the switch 111 is switched by a control signal from a control unit. When the switch 111 is in the On state, a signal that is a pilot signal generated by the PLL 101 and VCO 102 and amplified by the amplifier 103 is output to the coupler via the output line 104, while when the switch 111 is in the Off state, a signal that is a pilot signal generated by the PLL 101 and VCO 102 and amplified by the amplifier is blocked by the switch 93 and not output to the coupler via the output line 104.

With the above amplification apparatus of this embodiment being provided with the switch 111 on the output end of the pilot signal generation circuit, when the switch 111 is switched, the switching operation of the switch 111 can be performed at high speed since electric power is being constantly supplied by the PLL 101, VCO 102 and amplifier 103.

An amplification apparatus according to a sixth embodiment will now be described.

The circuit that generates pilot signals (pilot signal generation circuit) characterizes the constitution and operation of the amplification apparatus of this embodiment; the constitution and operation of other parts are the same as in the case of the amplification apparatus of the amplification apparatuses shown in the above first to fourth embodiments, so a description of the details is omitted.

Figure 6:
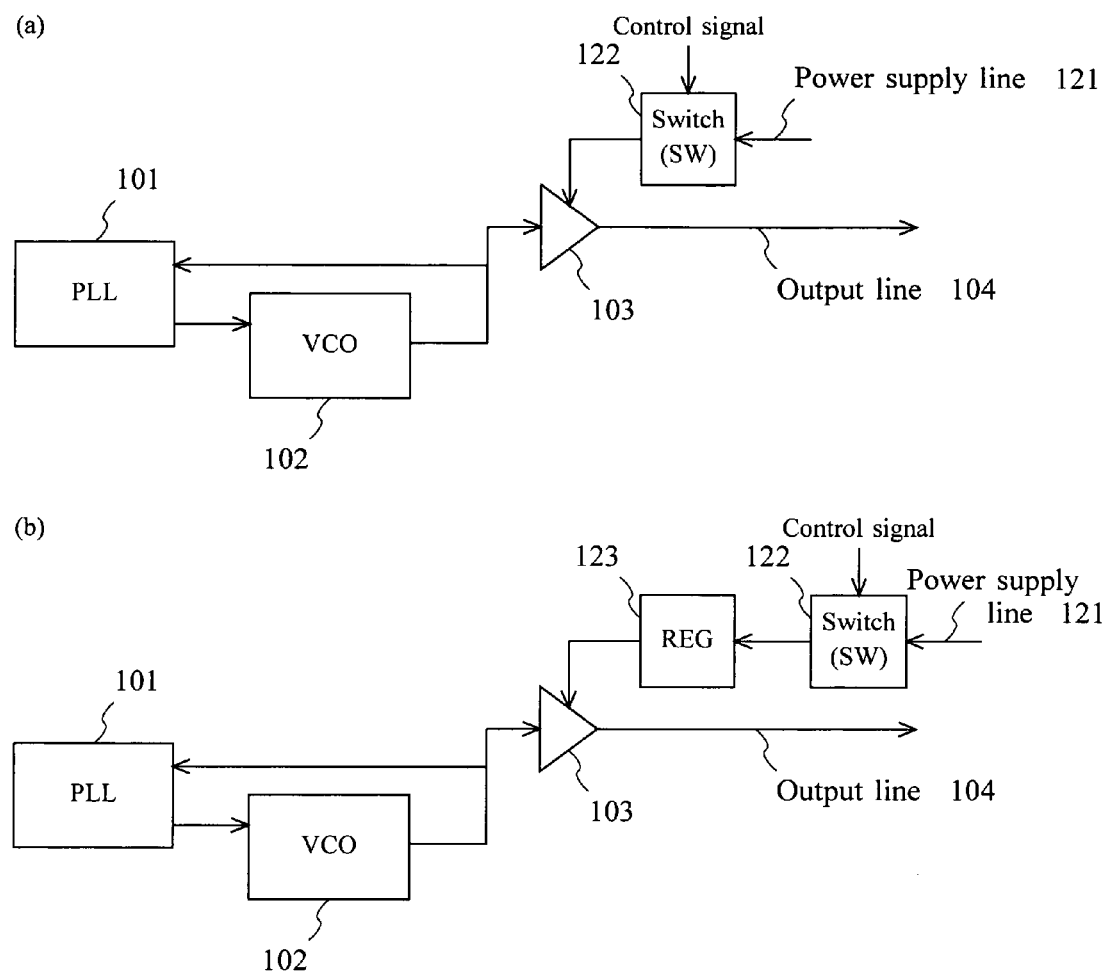
FIG. 6 is a diagram showing an example of the configuration of a pilot signal generation circuit according to a sixth embodiment of the present invention, configured with a SW provided in the power supply lines of the amplifiers that stabilizes the output level and prevents reflection.

FIG. 6(*a*) shows an example of the configuration of the pilot signal generation circuit of this embodiment.

Except for the point that a power signal switch (SW) 122 is provided connected to the output line 121 of the amplifier 103 and a switch is not provided on the output line 104 of the amplifier 103, the constitution and operation of the pilot signal generation circuit of this embodiment are the same as the constitution and operation of the pilot signal generation circuit of the fifth embodiment shown in FIG. 5, and the same symbols are used to denote the same component parts 101~104, so a detailed description is omitted.

In the pilot signal generation circuit of this embodiment, the On-Off state of the switch 122 is switched by a control signal from a control unit. When the switch 122 is in the On state, electric power is supplied to the amplifier 103 via the power supply line 121, whereby a signal that is a pilot signal generated by the PLL 101 and VCO 102 and amplified by the amplifier 103 is output to a coupler via the output line 104, while when the switch 122 is in the Off state, the electric power supply to the amplifier 103 is blocked by the switch 122, whereby a pilot signal generated by the PLL 101 and VCO 102 is not amplified by the amplifier 103 and not output to a coupler via the output line 104.

As described in the above, in the amplification apparatus of this embodiment the switch 122 is provided on the power supply line 121 of the amplifier unit (amplifier 103 in this embodiment) of the pilot signal generation circuit, and electric power is not supplied to the amplifier 103 when a pilot signal is not output, so the speed of the switching operation of the pilot signal can be maintained to a certain extent while reducing the electric power consumption.

In addition, as shown in FIG. 6(*b*), a configuration can be used in which a regulator (REG) 123 is provided between the switch 122 and the amplifier 103.

An amplification apparatus according to a seventh embodiment will now be described.

The circuit that generates pilot signals (pilot signal generation circuit) characterizes the constitution and operation of the amplification apparatus of this embodiment; the constitution and operation of other parts are the same as in the case of the amplification apparatus shown in the above first to fourth embodiments, for example, so a detailed description is omitted.

Figure 7:
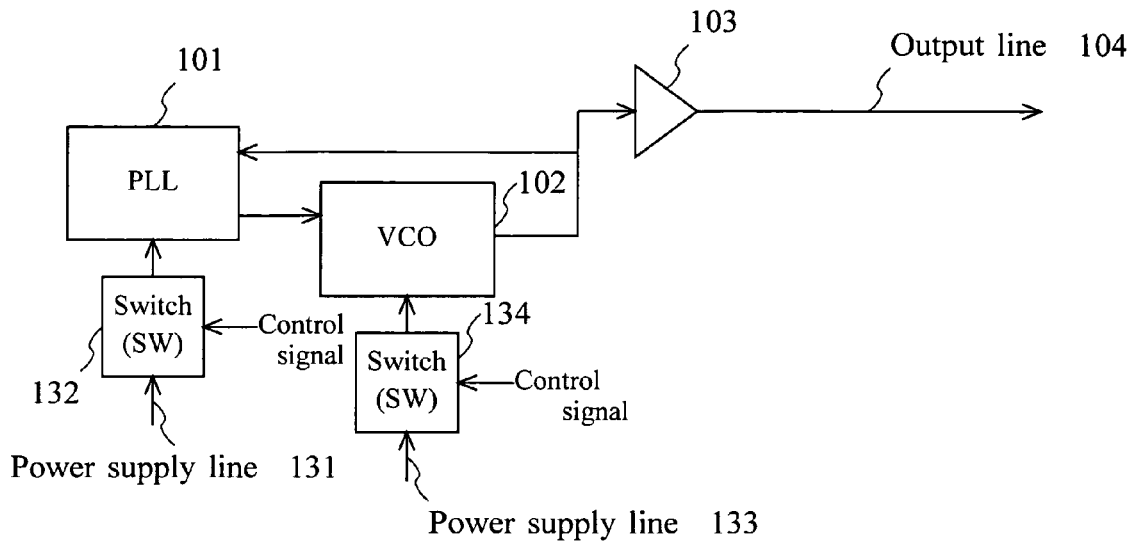
FIG. 7 is a diagram showing an example of the configuration of a pilot signal generation circuit according to a seventh embodiment of the present invention, configured with a SW provided in the power supply lines of the PLL and VCO.

FIG. 7 shows an example of the configuration of the pilot signal generation circuit of this embodiment.

Except for the point that a power signal switch (SW) 132 is provided connected to the power supply line 131 of the PLL 101 and a power signal switch 134 is provided connected to the power supply line 133 of the VCO 102, and a switch is not provided on the output line 104 of the amplifier 103, the constitution and operation of the pilot signal generation circuit of this embodiment are the same as the constitution and operation of the pilot signal generation circuit of the fifth embodiment shown in FIG. 5, and the same symbols are used to denote the same component parts 101~104, so a detailed description is omitted.

In the pilot signal generation circuit of this embodiment, the On-Off states of two switches 132 and 134 are switched by control signals from a control unit. When the two switches 132 and 134 are in the On state, electric power is supplied to the PLL 101 and VCO 102 via the respective power supply lines 131 and 133, whereby a signal that is a pilot signal generated by the PLL 101 and VCO 102 and amplified by the amplifier 103 is output to a coupler via the output line 104, while when the two switches 132 and 134 are in the Of state, the supply of electric power to the PLL 101 and VCO 102 is blocked by the respective switches 132 and 134, whereby a pilot signal generated by the PLL 101 and VCO 102 is not amplified by the amplifier 103 and not output to a coupler via the output line 104.

As described in the above, in the amplification apparatus of this embodiment switches 132 and 134 are provided on the power supply lines 131 and 133 of the PLL 101 and VCO 102, and electric power is not supplied to the PLL 101 and VCO 102 when a pilot signal is not output, enabling electric power consumption to be reduced.

Comparing the pilot signal generation circuits shown in the above fifth to seventh embodiments, the switching operation of the pilot signal generation circuit of the fifth embodiment shown in FIG. 5 is the fastest, the switching operation of the pilot signal generation circuit of the sixth embodiment shown in FIG. 6 is medium speed, and the switching operation of the pilot signal generation circuit of the seventh embodiment shown in FIG. 7 is the slowest. On the other hand, the pilot signal generation circuit of the seventh embodiment shown in FIG. 7 has the lowest power consumption, the pilot signal generation circuit of the sixth embodiment shown in FIG. 6 has a medium-low power consumption, and the pilot signal generation circuit of the fifth embodiment shown in FIG. 5 has the highest power consumption.

An amplification apparatus according to an eighth embodiment will now be described.

In the amplification apparatus of this embodiment, a burst signal (burst wave) is input as the signal to be amplified.

The constitution and operation of the amplification apparatus of this embodiment is characterized by the control of the pilot signal On-Off state based on the input level of the burst signal; the constitution and operation of other parts are the same as in the case of the amplification apparatus shown in the above first to seventh embodiments, for example, so a detailed description is omitted.

An example of a case in which software based control is used will be described.

In the amplification apparatus of this embodiment, input signal level is detected by couplers 11 and 81, wave detection circuits 12 and 82 and A/D converters 13 and 83, and the On-Off state of the pilot signal switches 15, 32, 35, 52, 55, 93, 111, 122, 132, and 134 is controlled by control units 21, 41, 61, and 87 based on the result of a comparison of the detection result with a prescribed threshold value.

Specifically, a threshold value relating to input signal level is set beforehand in the control units 21, 41, 61, and 87 and, based on information input from the A/D converters 13 and 83, the sizes of the input signal level detection values and the threshold value are compared. When a level detection value is small compared to the threshold value, control is effected to switch the switches 15, 32, 35, 52, 55, 93, 111, 122, 132, and 134 to the Off state so there is no pilot signal output, and when the level detection value is large compared to the threshold value, control is effected to switch the switches 15, 32, 35, 52, 55, 93, 111, 122, 132, and 134 to the On state to output pilot signals.

In addition, with respect to when a level detection value and threshold value are the same, control can be effected to switch the switches 15, 32, 35, 52, 55, 93, 111, 122, 132, and 134 to the Off state, or control can be effected to switch the switches 15, 32, 35, 52, 55, 93, 111, 122, 132, and 134 to the On state.

As another example, a case in which hardware based control is used will be described.

Figure 8:
FIG. 8 is a diagram for explaining an example of the On-Off control of a pilot signal based on detection of a burst signal, according to an eighth embodiment of the present invention.
Figure 8:
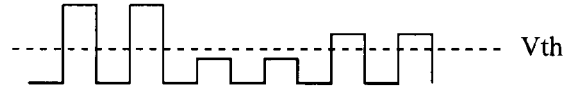
Figure 8:
Figure 8:
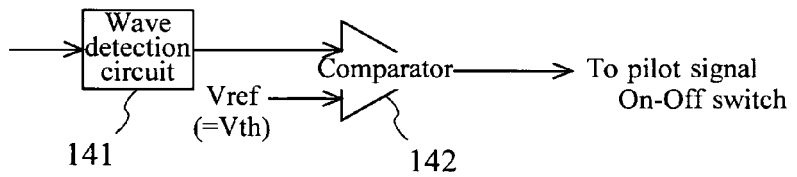

FIG. 8(a), (b), (c) show examples of signal waveforms in an example of a hardware based configuration used to detect burst signals and control the pilot signal On-Off state. FIG. 8(d) shows an example of a pilot signal On-Off state control circuit according to such a configuration.

As shown in FIG. 8(d), the pilot signal On-Off state control circuit according to this configuration example is comprised of a combination of a wave detection circuit 141 and a comparator 142 constituted using an operational amplifier, for example.

An input signal acquired by a coupler provided at the same location as that of the couplers 11 and 81 shown in the first to seventh embodiments, for example, is input to the wave detection circuit 141.

A voltage (reference voltage) Vth representing a preset threshold value, for example, is input to the comparator 142 as reference voltage Vref.

The output end of the comparator 142 is connected to the control units 21, 41, 61, and 87.

In the pilot signal On-Off state control circuit according to this configuration example, an input signal is detected by the wave detection circuit 141, and a voltage representing the level of the input signal thus obtained is compared to a preset reference voltage Vth by the comparator 142, a signal representing the comparison result is output to the control units 21, 41, 61, and 87, and the control units 21, 41, 61, and 87 control the On-Off state of the switches 15, 32, 35, 52, 55, 93, 111, 122, 132, and 134 based on the signal from the comparator 142 representing the comparison result.

Specifically, when the level of an input signal is low compared to a level corresponding to the reference voltage Vth, a control signal to stop pilot signal output is output to the control end of the switches 15, 32, 35, 52, 55, 93, 111, 122, 132, and 134, while when the level of an input signal is high compared to a level corresponding to the reference voltage Vth, a control signal to output a pilot signal is output to the control end of the switches 15, 32, 35, 52, 55, 93, 111, 122, 132, and 134.

In addition, with respect to when a input signal level and a threshold value are the same, control can be effected to switch the switches 15, 32, 35, 52, 55, 93, 111, 122, 132, and 134 to the Off state, or control can be effected to switch the switches 15, 32, 35, 52, 55, 93, 111, 122, 132, and 134 to the On state.

When, for example, the wave detection circuit 141 detects that an input signal contains a plurality of radio frequency (RF) band burst signals having various levels, as shown in FIG. 8(a), the comparator 142 compares a voltage representing the level of each burst signal with the reference voltage Vth, as shown in FIG. 8(b), and a signal for switching the switches 15, 32, 35, 52, 55, 93, 111, 122, 132, and 134 into the On state is output from the comparator 142 only with respect to burst signals having a voltage that exceeds the reference voltage Vth (or is equal to or greater than the reference voltage Vth).

As described in the above, the amplification apparatus of this embodiment is provided with a detection unit (wave detection circuits 12, 82, and 141 in this embodiment) that detects burst signals, and when a burst signal is detected, the pilot signal On-Off state is controlled according to the input level of the burst signal.

Therefore, the same effect as that shown with the above first embodiment can also be obtained with the configuration of the amplification apparatus of this embodiment when a burst signal is input as the signal to be amplified.

In this amplification apparatus, also, the amplification signal level detection means is constituted by the input signal level detection functions of the couplers 11 and 81, wave detection circuits 12 and 82 and A/D converters 13 and 83, and the input signal level detection functions of a coupler and the wave detection circuit 141; and the reference signal control means is constituted by the functions of the control units 21, 41, 61 and 87 that control the switches 15, 32, 35, 52, 55, 93, 111, 122, 132, and 134 to effect non-combination of the signal to be amplified and the pilot signal, or by the functions of the comparator 142 and control units 21, 41, 61 and 87 that control the switches 15, 32, 35, 52, 55, 93, 111, 122, 132, and 134 to effect non-combination of the signal to be amplified and the pilot signal.

An amplification apparatus according to a ninth embodiment will now be described.

In the amplification apparatus of this embodiment, a burst signal (burst wave) is input as the signal to be amplified.

The constitution and operation of the amplification apparatus of this embodiment is characterized by the control of the pilot signal On-Off state based on the input level of the burst signal; the constitution and operation of other parts are the same as in the case of the amplification apparatus shown in the above first to seventh embodiments, for example, so a detailed description is omitted.

In the amplification apparatus of this embodiment, the control units 21, 41, 61 and 87 control the pilot signal On-Off state based on the cycle period of burst signals input as the signal to be amplified.

Figure 9:
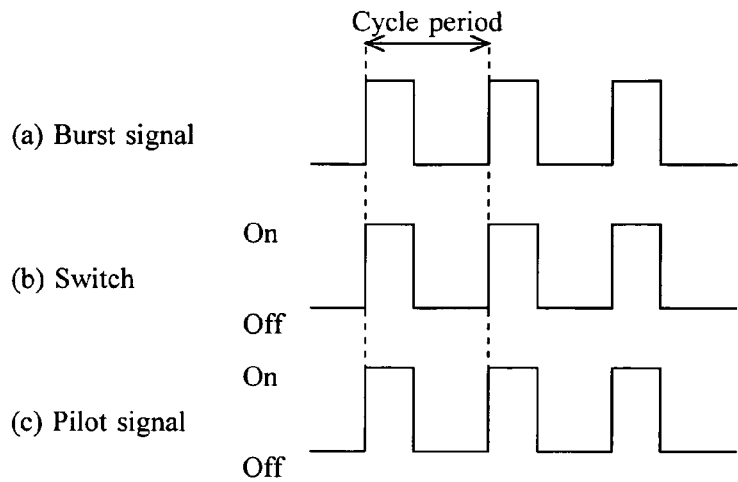
FIG. 9 is a diagram for explaining an example of the On-Off control of a pilot signal based on burst signal frequency, according to a ninth embodiment of the present invention.

Specifically, when a burst signal is periodically input, as shown in FIG. 9(*a*), for example, the control units 21, 41, 61 and 87 control the On-Off state of the switches 15, 32, 35, 52, 55, 93, 111, 122, 132, and 134 to match the cycle period, as shown in FIG. 9(*b*), so that, as shown in FIG. 9(*c*), the pilot signal is in an On state when a burst signal is input, and combines with the burst signal.

Here, the burst signal cycle period or burst signal input timing can be set beforehand, or can be communicated from inside or outside the amplification apparatus.

As one example, the level of an input signal can be detected and the cycle period or input timing of the burst signal detected based on the detected level.

Therefore, the same effect as that shown with the above first embodiment can also be obtained with the configuration of the amplification apparatus of this embodiment when a burst signal is input as the signal to be amplified.

In addition, in the amplification apparatus of this embodiment, the no-input-signal detection means is constituted by the functions of the control units 21, 41, 61 and 87 that detect a no-burst-signal-input state based on the cycle period or timing of the burst signal to be amplified. This is substantially the same with respect to a case in which a burst signal input state is detected, which is encompassed by this invention.

Next, a comparative example with respect to the present invention, and concrete problems in the comparative example, are described.

The items described with respect to the comparative example are not necessarily all limited to prior art.

Figure 10:
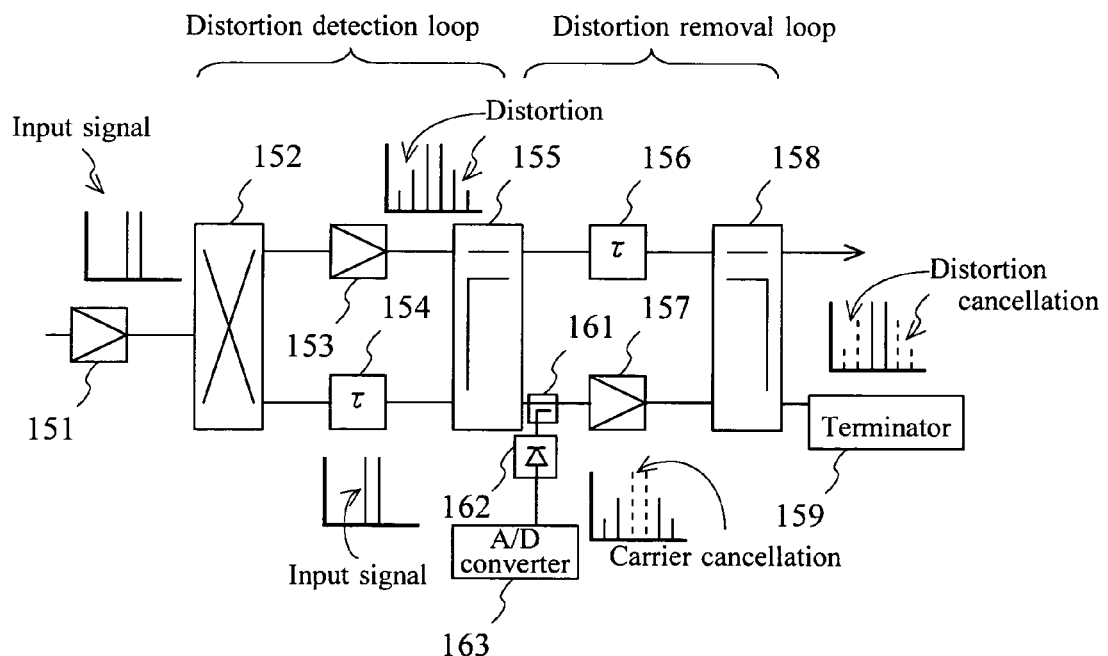
FIG. 10 shows an example of the configuration of an amplification apparatus.
Figure 11:
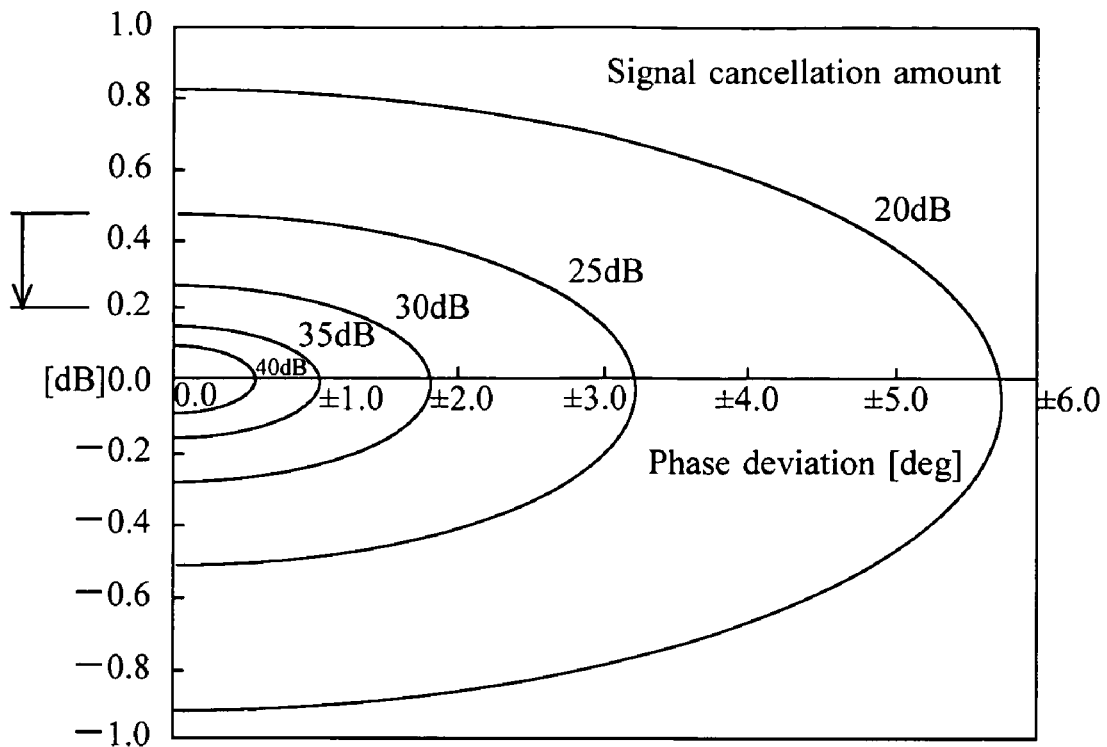
FIG. 11 is a diagram showing an example of the characteristics of cancellation amounts based on the amplitude deviation and phase deviation.

FIG. 10 shows an example of the configuration of the amplification apparatus according to the comparative example.

The amplification apparatus according to this comparative example is equipped with a pre-amplifier 151, a first directional coupler 152, a main amplifier 153, a first delay line (delay route) 154, and a second directional coupler 155; the functions of these constitute a distortion detection loop.

The amplification apparatus of this comparative example is also equipped with a second delay line (delay route) 156, an auxiliary amplifier (error amplifier) 157, a third directional coupler 158 and a terminator 159; the functions of these constitute a distortion removal loop.

The amplification apparatus of this comparative example is also equipped with a coupler 161 provided between the second directional coupler 155 and the auxiliary amplifier 157, a wave detector 162 and an A/D converter 163; the functions of these make it possible to acquire information relating to distortion component signals detected by the distortion detection loop.

Also, while not shown, in the amplification apparatus of this comparative example, pilot signals for controlling the distortion detection loop and distortion removal loop are always combined with the signal to be amplified.

In the amplification apparatus of this comparative example, distortion detection and distortion removal are performed in the respective distortion detection loop and distortion removal loop by aligning the amplitudes and delay times of the components to be cancelled contained in the two signals to be combined, and combining the two signals with the components to be cancelled in opposite phase, thereby realizing distortion compensation based on the feedforward method.

Equation 1 expresses the general characteristics of the cancellation amounts based on the amplitude deviation and phase deviation in the distortion detection loop and distortion removal loop.

Cancellation amount=$10 \log \{1+10^{d/10} - 2 \cdot 10^{d/20} \cos(p)\}$     (Equation 1)

Here, d is amplitude deviation [dB], p is phase deviation [deg]

Distortion compensation amplification apparatuses based on the feedforward method are utilized, for example, as multicarrier common amplification apparatuses provided in mobile communication base stations in second generation, 2.5 generation, and third generation (IMT-200).

Also, in recent years, progress has been made in the practical implementation of CDMA signal time division (burst) and the like, such as in High Data Rate (HDR) systems and the like.

Figure 12:
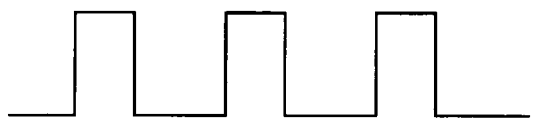
FIG. 12 is a diagram showing an example of the output from an amplification apparatus during input of a burst signal.
Figure 12:
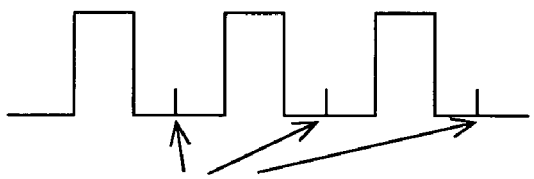

However, when time division (bursting) of input signals is implemented in the case of the amplification apparatus of the comparative example shown in FIG. 10, as shown in FIG. 12(*a*), for example, there is the inconvenience that pilot signal components are output even when amplified signal output from the amplification apparatus is off, as shown in FIG. 12(*b*).

For example, since the operation of the auxiliary amplifier 157 differs during burst times, vector device values in the auxiliary amplifier 157 differ. Also, while feedforward based distortion compensation operations are not needed when burst signals are in the Off state, because the pilot signal is a normally On state, it is necessary to constantly perform feedforward based distortion compensation operations.

In contrast, with the amplification apparatus according to the embodiments shown above (first to seventh embodiments), this inconvenience is eliminated, so that as the pilot signal output is stopped when input signals are in the Off state, it is possible to reduce electric power consumption and improve signal characteristics and the like.

The configurations of the amplification apparatus and the like according to the present invention are not necessarily limited to those shown in the foregoing, and various configurations may be used. In addition, it is also possible to provide the method or mode of executing processing according to the invention as a program or the like for realizing the method or mode.

Also, the field of application of this invention is not necessarily limited to that described above, the invention being applicable to various fields.

Moreover, the various types of processing performed in the amplification apparatus and so forth of this invention may be constituted by being implemented in hardware resources equipped with a processor and memory and the like, for example, being controlled by means of a processor executing a control program stored in ROM (Read Only Memory). Further, the various functional means for executing this processing may also be constituted as independent hardware circuits.

In addition, the present invention may also be understood as one wherein the above control program (itself) is stored on a floppy disc (®), CD (Compact Disc)-ROM or other computer-readable recording media, so that the processing according to the present invention can be implemented by said control program being input from the recording media into a computer and executed by a processor.

INDUSTRIAL APPLICABILITY

As described in the foregoing, when in accordance with the amplification apparatus of this invention, equipped with a distortion detection loop and a distortion removal loop, distortion generated by an amplifier is being compensated for, signals input to be amplified are monitored, the presence or absence of said input signals, for example, or burst states and the like of said input signals, are recognized, and the On-Off state of a reference signal used to control distortion compensation processing in the distortion detection loop, or the On-Off state of a reference signal used to control distortion compensation processing in the distortion removal loop, or the On-Off state of both reference signals are controlled, making it possible to improve efficiency with respect to a control configuration relating to distortion compensation using a reference signal.

The invention claimed is:

1. In an amplification apparatus having a distortion detection loop that detects distortion components contained in an amplified signal to be amplified that is amplified by an amplifier, and a distortion removal loop that removes distortion components from the amplified signal, using the distortion components detected by the distortion detection loop, combines a reference signal with the signal to be amplified, and performs control relating to distortion compensation, using said reference signal,
   an amplification apparatus wherein the signal to be amplified is detected and output of said reference signal is controlled in accordance with a state of the detected signal to be amplified.

2. In an amplification apparatus having a distortion detection loop that detects distortion components contained in an amplified signal to be amplified that is amplified by an amplifier, and a distortion removal loop that removes distortion components from the amplified signal, using the distortion components detected by the distortion detection loop, combines a reference signal with the signal to be amplified, and performs control relating to distortion compensation, using said reference signal,
   wherein the amplification apparatus comprises amplification signal detection means that detects said signal to be amplified, and
   reference signal control means that, when the amplification signal detection means detects that there is no input of a signal to be amplified, performs control to effect non-output of the reference signal.

3. An amplification apparatus according to claim 1,
   having a reference signal generation circuit means that has a reference signal generation function and a switch that stops output of said reference signal,
   wherein means that performs control of the reference signal puts reference signal output into a stop state by switching the switch of the reference signal generation means into an Off state.

4. An amplification apparatus according to claim 2,
   having a reference signal generation circuit means that has a reference signal generation function and a switch that stops output of said reference signal,
   wherein means that performs control of the reference signal puts reference signal output into a stop state by switching the switch of the reference signal generation means into an Off state.

* * * * *